United States Patent [19]

Takabatashi et al.

[11] Patent Number: 4,777,464
[45] Date of Patent: Oct. 11, 1988

[54] MAGNETIC FIELD GENERATING DEVICE FOR NMR-CT

[75] Inventors: Hirofumi Takabatashi; Hideya Sakurai, both of Mishima, Japan

[73] Assignee: Sumitomo Special Metal Co., Ltd., Osaka, Japan

[21] Appl. No.: 101,365

[22] Filed: Sep. 25, 1987

[51] Int. Cl.[4] .............................................. H01F 7/02
[52] U.S. Cl. ..................................... 335/306; 324/318
[58] Field of Search ....................... 335/302, 304, 306; 324/318, 319

[56] References Cited

U.S. PATENT DOCUMENTS

| | | | |
|---|---|---|---|
| 4,647,887 | 3/1987 | Leupold | 335/306 X |
| 4,654,618 | 3/1987 | Leupold | 335/306 X |
| 4,675,609 | 6/1987 | Danby et al. | 335/306 X |

Primary Examiner—George Harris
Attorney, Agent, or Firm—Watson, Cole, Grindle & Watson

[57] ABSTRACT

A magnetic field generating device for the NMR-CT comprises a pair of opposing permanent magnet segments magnetically coupled by a yoke which define therebetween an air gap where a magnetic field is created. Each segment has a pole piece attached to its gap-facing surface. Each segment is composed of a ferrite magnet and a rare earth magnet, one of the two magnets being disposed in the central portion of the segment and the other disposed around the one magnet. The thickness of the ferrite magnet in the direction of attaching it to the yoke is larger than that of the rare earth magnet.

9 Claims, 4 Drawing Sheets

Fig. 2
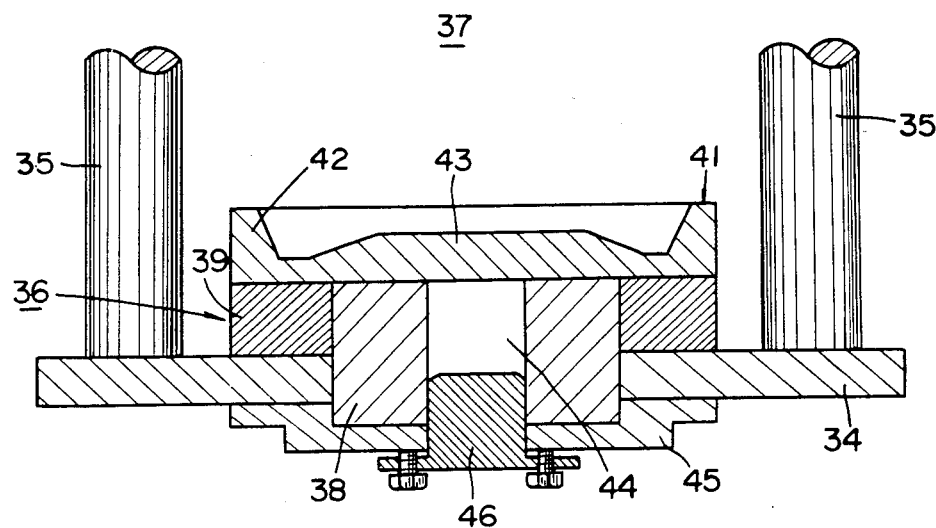
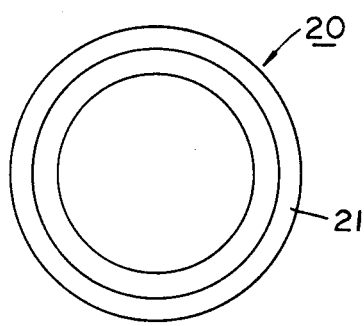
Fig. 7A
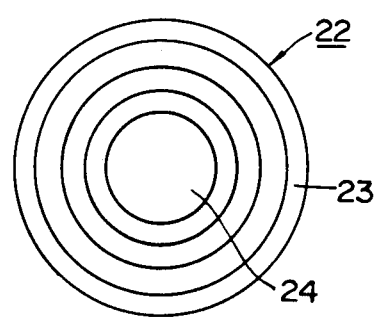
Fig. 8A
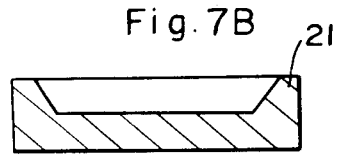
Fig. 7B
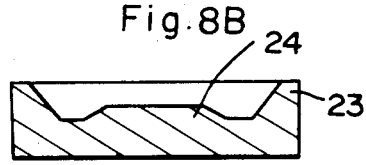
Fig. 8B

MAGNETIC FIELD GENERATING DEVICE FOR NMR-CT

BACKGROUND OF THE INVENTION

1. Field of the Invention

This invention relates to a magnetic field-generating device which is used in medical-purpose nuclear magnetic resonance-computerized tomography (hereinafter referred to as NMR-CT) and which employs a permanent magnet.

2. Description of the Prior Art

In order to obtain a desired tomographic image of the human body by NMR-CT, a magnetic field of 1-10 KG (0.1-1 T) in strength and $10^{-4}$ or less in uniformity are required.

Recently, a magnetic field-generating device employing a permanent magnet has been considered as the most economical device for NMR-CT because it does not consume electric power and does not employ expensive coolant (such as helium), as do other types of magnetic field-generating devices employing normal-conducting or superconducting magnets.

Prior to the present invention, the present applicant has proposed several practical configurations of magnetic field generating devices which include permanent magnets therein (see U.S. Pat. No. 4,672,346 and EP 0161782 A1). One such device is shown in FIG. 9. It includes a pair of permanent magnet segments 1, 1 which are magnetized in the same direction and are spaced from each other so as to define an air gap 4 therebetween, their poles of different polarities being mutually opposed. The opposing surface of each permanent magnet segment has a pole piece 2 attached thereto which is formed with only an annular projection 5 or with both an annular projection 5 and a convex projection 6 located in the central portion of the annular projection, and these permanent magnet segments are magnetically coupled together by a yoke 3 to create a magnetic field within the air gap 4 (FIG. 9 shows the pole piece formed with both the annular projection and the convex projection).

It is known that the permanent magnet of a magnetic field-generating device can be made of a ferrite magnet, an alunico magnet, and a rare earth cobalt magnet. In this connection, the present applicant has proposed (in Japanese Patent Publication No. 61-34242) that the device can be remarkably miniaturized by using Fe-B-R series permanent magnet (B, Fe are the principal components; R is selected out of the light rare earth element group which is one of the rich resources and whose center is Nd or Pr) which provides a high energy product of more than 30 MGOe.

According to the foregoing prior technique, a pair of permanent magnet segments is normally made only by one of the aforementioned permanent magnets. For example, if the ferrite magnet only is employed, the device can be produced at a low cost, but is limited in the degree of miniaturization and the extent of field strength. On the other hand, if the rare earth magnet, such as an Fe-B-R series magnet is employed, this kind of magnet is effective to miniaturize the device and enhance the field strength, but is costly.

Nowadays, due to improvements in peripheral apparatus other than the magnetic field-generating device, it is possible to obtain a clear image even when the field strength within the air gap is of the order of 1-1.5 KG. Therefore, a novel magnetic field-generating device is demanded which is superior in practicability, i.e., is compatible with recent advances and economically advantageous, and especially, an effective disposition and structure of the permanent magnet serving as the magnetic field generating source is required.

SUMMARY OF THE INVENTION

In view of the existing circumstances, it is an object of the present invention to provide a small-sized, economical magnetic field-generating device for the NMR-CT which includes permanent magnet segments made of permanent magnets of different materials properly disposed and has a structure exhibiting a good magnetic efficiency.

To achieve the object of providing a small-sized, economical magnetic field-generating device, the present inventor proposed herein to make each of permanent magnet segments of a pair by a rare earth magnet and a ferrite magnet such that the merits of these permanent magnets can be utilized effectively, that having been perceived through considerable examination.

Specifically, the present inventor has perceived that in a magnetic-field generating device, with the determination of the size of an air gap and of the size of a uniform magnetic field space in which an object subjected to medical examination is inserted, the size (diameter) of a pole piece necessary for the above is uniquely determined; hence, if the device is made only of the rare earth permanent magnet, it is difficult to operate the device magnetically effectively, i.e., at an optimum operating point, particularly as the field strength within the air gap approaches about 1 KG; however, if the ferrite magnet is incorporated together with the rare earth magnet and properly disposed as described hereinafter, the operating point of these permanent magnets can be optimized.

Briefly, in one feature, the present invention resides in a magnetic field-generating device comprising a pair of permanent magnet segments mutually opposing to define an air gap therebetween and magnetically coupled by a yoke, and pole pieces each attached to the gap-facing surface of the corresponding permanent magnet segment, wherein a magnetic field is created within the air gap, characterized in that each permanent magnet segment is composed of a ferrite magnet disposed in the central portion thereof and a rare earth magnet disposed around the ferrite magnet, and the thickness of the ferrite magnet in the direction of attaching it to the yoke is larger than the thickness of the rare earth magnet in the direction of attaching it to the yoke.

In another feature, the present invention resides in a magnetic field-generating device comprising a pair of permanent magnet segments mutually opposing to define an air gap therebetween and magnetically coupled by a yoke, and pole pieces each attached to the gap-facing surface of the corresponding permanent magnet segment, wherein a magnetic field is created within the air gap, characterized in that each permanent magnet segment is composed of a rare earth magnet disposed in the central portion thereof and a ferrite magnet disposed around the rare earth magnet, and the thickness of the ferrite magnet in the direction of attaching it to the yoke is larger than the thickness of the rare earth magnet in the direction of attaching it to the yoke.

BRIEF DESCRIPTION OF THE DRAWINGS

FIG. 2 is a fragmentary vertical sectional view of a second embodiment of the magnetic field-generating device for NMR-CT according to the present invention;

FIGS. 7(A) and 8(A) and FIGS. 7(B) and 8(B) are plan views and vertical sectional views, respectively, of embodiments of a pole piece forming a part of the magnetic field-generating device for NMR-CT according to the present invention.

DESCRIPTION OF THE PREFERRED EMBODIMENTS

The present invention employs rare earth magnets and ferrite magnets disposed in the arrangement wherein permanent magnet segments of a pair mutually opposing to define an air gap therebetween are magnetically coupled by a yoke, and pole pieces are attached to the gap-facing surfaces of the respective permanent magnet segments to create a magnetic field within the air gap. Other configurations and arrangements not mentioned above can also be used. That is, it is desirable to select the magnetic property, shape and dimension of the permanent magnet segment, the shape and dimension of the yoke and of the pole piece and the like, depending on a desired size of the air gap, a desired strength and uniformity of the magnetic field within the air gap, etc.

Each of the magnet segments composing the present device is made up of a rare earth magnet and a ferrite magnet, one of the two magnets being disposed in the central portion of the segment and the other being disposed around the central one so as to form a single body. With regard to the permanent magnet disposed circumferentially, it is not necessary to dispose this magnet along the whole circumference of the central permanent magnet, and this may be (segmented and) disposed at appropriate points along the circumference depending on a desired field strength and the like.

The rare earth magnet forming a part of the magnet segment is preferably selected out of anisotropic rare earth magnets, such as rare earth cobalt magnet and Fe-B-R series magnet, and the ferrite magnet is preferably selected out of anisotropic ferrite magnets, such as strontium ferrite magnet and balium ferrite magnet.

At the time of disposing the rare earth magnet and the ferrite magnet in the manner above, if the thickness of the ferrite magnet is made smaller than that of the rare earth magnet, demagnetization appears due to the diamagnetic field of the rare earth magnet and a desired field strength can hardly be obtained. Therefore, the thickness of the ferrite magnet in the direction of attaching it to the yoke must be made larger than the thickness of the rare earth magnet in the direction of attaching it to the yoke. In this connection, it is also profitable to select some ferrite magnet having a very strong coercive force (Hc) as the ferrite magnet disposed in the vicinity of the rare earth magnet. Further, the outer diameter of each permanent magnet also is desirably selected depending on a required field strength and the like.

With regard to the ratio in thickness of the rare earth magnet to the ferrite magnet composing each magnet segment, the thickness of the rare earth magnet is desirably set to one half or less of the thickness of the ferrite magnet from the view point of miniaturization and in consideration of the optimum operating point of both magnets.

The yoke forming a part of the magnetic field generating device can take various configurations and shapes.

Figure 4:
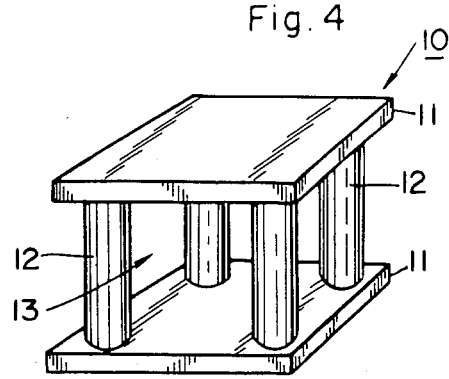
FIGS. 4 through 6 are perspective views showing embodiments of a yoke forming a part of the magnetic field-generating device for NMR-CT according to the present invention.

For instance, a yoke 10 shown in FIG. 4 comprises a pair of plate-like yoke pieces 11, 11 disposed opposingly which are coupled by column-like yoke pieces 12 (their number is four in the drawing). As the permanent magnet segments (not shown) according to the present invention are attached to the opposing inner surfaces of the plate-like yoke pieces 11, 11, a desired air gap 13 is formed. This illustrated structure has the advantage that an object subjected to medical examination can be inserted into the air gap 13 through between the column-like yoke pieces 12 in either direction, and is easy to assemble and perform maintenance and management.

Although the plate-like yoke pieces 11, 11 are square in FIG. 4, they may take any shape, for example, a disc shape. If a rectangular shape is adopted, this facilitates carrying and installing the device in a narrow spot.

In addition, the shape, number, etc. of the column-like yoke pieces 12 can vary, provided that the magnetic flux passing therethrough is not saturated.

Figure 5:
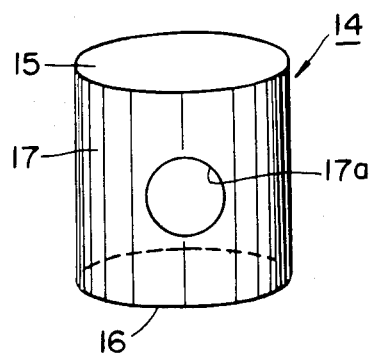

A yoke 14 shown in FIG. 5 comprises disc-like yoke pieces 15, 16 disposed opposingly which are coupled by a circular cylinder-like yoke piece 17. As the permanent magnet segments (not shown) are attached to the opposing inner surfaces of the disc-like yoke pieces 15, 16, the air gap is formed which is surrounded by the cylinder-like yoke piece 17. Since the cylinder-like yoke piece 17 is formed only with an opening 17a to insert an object subjected to medical examination into the inside, this type has the advantage that there appears little magnetic field leakage from the yoke 14.

Figure 6:
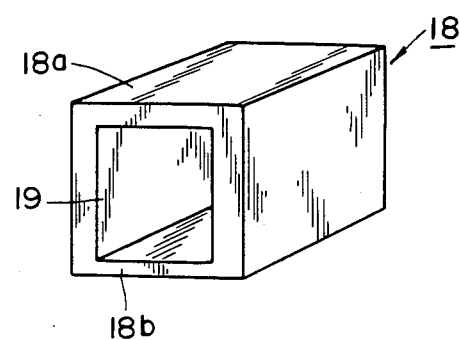

A yoke 18 shown in FIG. 6 is a quadrangular cylinder-like yoke whose opening 19 extends horizontally. As the pair of permanent magnet segments (not shown) is attached to the inner surfaces of upper and lower yoke portions 18a and 18b, the air gap is formed.

Similarly to the permanent magnet or yoke, the magnetic pole piece secured to the gap-facing surface of the permanent magnet segment can take various configurations and shapes depending on the required field strength, field uniformity, etc.

For instance, a pole piece 20 shown in FIGS. 7a and 7b is a disc-like pole piece, whose opposing (exposed) surface is formed in its peripheral portion with an annular projection 21 having a given inner diameter and height that is trapezoidal in cross section.

A pole piece 22 shown in FIGS. 8a and 8b is a disc-like pole piece whose opposing (exposed) surface is formed in its peripheral portion with an annular projection 23 having a given inner diameter and height that is trapezoidal in cross section and in its central portion with a convex projection 24 having a given outer diameter and height that is trapezoidal in cross section.

Embodiments of the present invention will now be described with reference to FIGS. 1a, 1b, 2, 3a and 3b in which the same reference numeral designates same or identical portions.

Figure 1A:
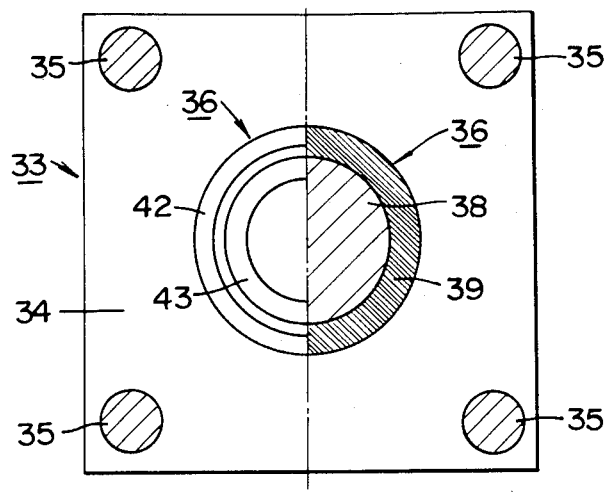
FIG. 1A is a horizontal sectional view of a first embodiment of a magnetic field-generating device for NMR-CT according to the present invention taken in the direction of the arrows along line A—A in FIG. 1B.
Figure 1B:
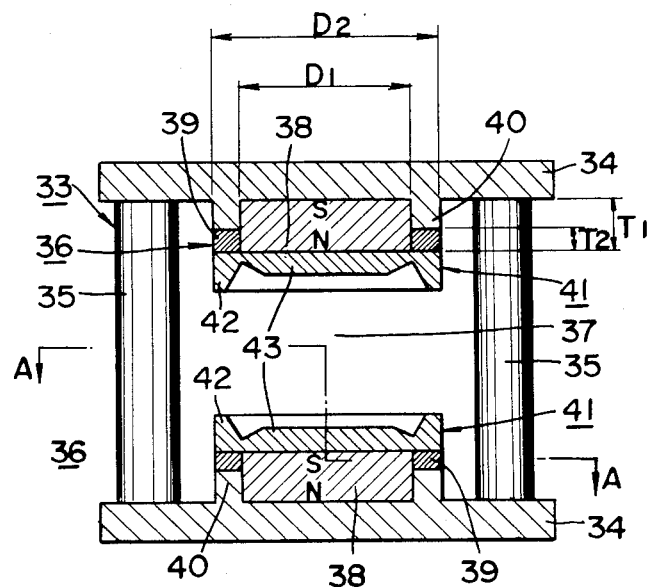
FIG. 1B is a vertical sectional view of the first embodiment.

FIGS. 1a and 1b show a first embodiment of the magnetic field generating device for NMR-CT according to the present invention. In the first embodiment, a yoke 33 comprises a pair of square plate-like yoke pieces 34, 34 disposed opposingly and coupled by four column-like yoke pieces 35. Permanent magnet segments 36, 36 according to the present invention are attached to the opposing inner surfaces of the plate-like yoke pieces 34, 34 to form a given air gap 37 therebetween.

Each permanent magnet segment 36 comprises a disc-like ferrite magnet 38 having an outer diameter $D_1$ and a thickness $T_1$ which is disposed in the central portion of the segment, and a ring-like rare earth magnet 39 having an outer diameter $D_2$, an inner diameter $D_1$ and a thickness $T_2$ which is disposed in the peripheral portion.

The thickness $T_2$ of the rare earth magnet 39, 39 is smaller than that of the ferrite magnet 38, 38.

In order that both the ferrite magnet 38, 38 and the rare earth magnet 39, 39 may define the same plane on each pole surface on the side of the air gap 37, an annular projection seat 40, 40 made of yoke material is provided around the periphery of the ferrite magnet 38, 38 attached to the plate-like yoke piece 34, 34, and the rare earth magnet 39, 39 is attached to the annular projection seat 40, 40.

Each of the ferrite magnet 38, 38 and the rare earth magnet 39, 39 composing the permanent magnet segment 36, 36 is made up of a number of block-like permanent magnet pieces, after magnetization these magnet pieces being assembled into the aforementioned shape so as to exhibit the magnetization direction perpendicular to the pole surface.

To the pole surface on the side of the air gap 37 of the permanent magnet segment 36, 36 is attached to a magnetic pole piece 41, 41. Each pole piece 41 has an annular projection 42 of trapezoidal in cross section formed in the peripheral portion and a convex projection 43 of flat trapezoidal in cross section formed in the central portion.

By the foregoing structure and through incorporation of the inexpensive ferrite magnet and the rare earth magnet having superior magnetic properties, both magnets can be utilized stably and magnetically effectively, thereby producing a small-sized, inexpensive magnetic field generating device.

A second embodiment shown in FIG. 2 has a similar arrangement wherein the ferrite magnet 38 is disposed in the central portion and the rare earth magnet 39 in the peripheral portion. Specifically, without forming the annular projection seat on the plate-like yoke piece 34 (see FIG. 1), the rare earth magnet 39 is directly attached to the upper surface (in the drawing) of the plate-like yoke piece 34. The cylinder-like ferrite magnet 38 having a through-hole 44 in its central portion passes through the central portion of the plate-like yoke piece 34 and is secured by a cap-like yoke piece 45. In FIG. 2, reference numeral 46 designates a magnetic member for field fine-adjustment which, by adjusting its extent of insertion into the through-hole 44 formed in the ferrite magnet 38, can fine-adjust the field strength within the air gap 37.

Figure 3A:
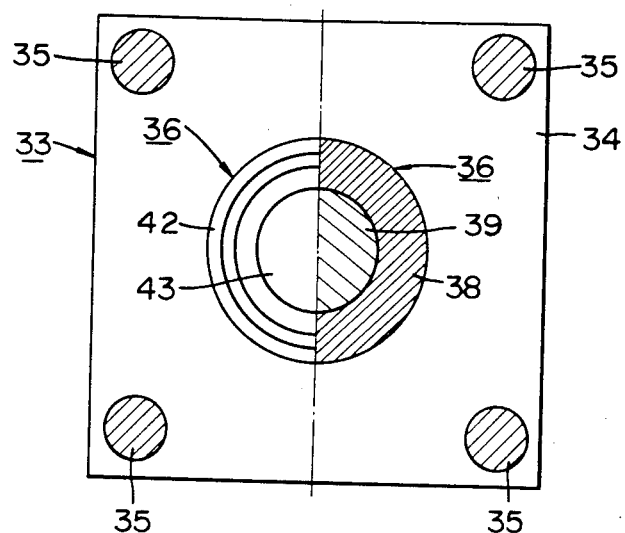
FIG. 3A is a horizontal sectional view of a third embodiment of the magnetic field-generating device for NMR-CT according to the present invention taken in the direction of the arrows along line B—B in FIG. 3B.
Figure 3B:
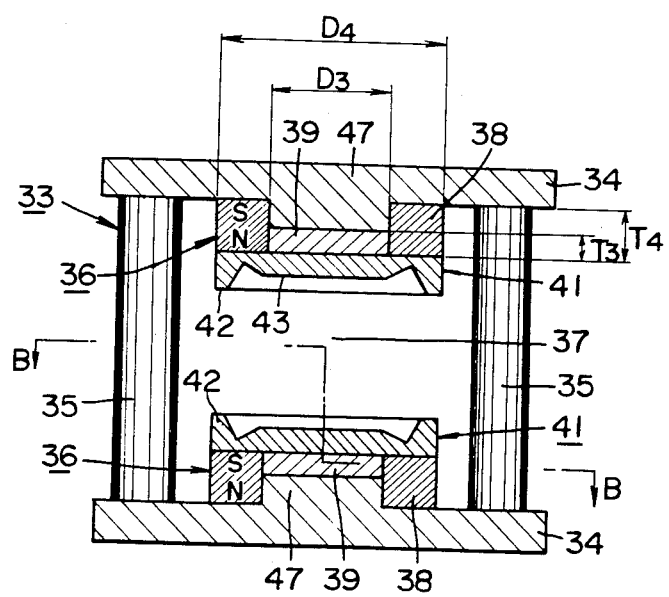
FIG. 3B is a vertical sectional view of the third embodiment.

FIGS. 3a and 3b show a third embodiment of the present invention. The yoke 33 comprises a pair of square plate-like yoke pieces 34, 34 disposed opposingly and coupled by four column-like yoke pieces 35. The permanent magnet segments 36, 36 according to the present invention are attached to the opposing inner surfaces of the plate-like yoke pieces 34, 34 to form the given air gap 37 therebetween.

Each permanent magnet segment 36 comprises a disc-like rare earth magnet 39 having an outer diameter $D_3$ and a thickness $T_3$ which is disposed in the central portion of the segment and a ring-like ferrite magnet 38 having an outer diameter $D_4$, an inner diameter $D_3$ and a thickness $T_4$ which is disposed in the peripheral portion.

The thickness $T_3$ of the rare earth magnet 39, 39 is smaller than that of the ferrite magnet 38, 38.

In order that both the rare earth magnet 39, 39 and the ferrite magnet 38, 38 may define the same plane on each pole surface on the side of the air gap 37, a circular projection seat 47, 47 made of yoke material is provided inside the ferrite magnet 38, 38 attached to the plate-like yoke piece 34, 34, and the rare earth magnet 39, 39 is attached to the circular projection seat 47, 47.

Each of the rare earth magnet 39, 39 and the ferrite magnet 38, 38 composing the permanent magnet segment 36, 36 is made up of a number of block-like permanent magnet pieces, after magnetization these magnet pieces being assembled into the aforementioned shape so as to exhibit the magnetization direction perpendicular to the pole surface.

To the pole surface on the side of the air gap 37 of the permanent magnet segment 36, 36 is attached the pole piece 41, 41. Each pole piece 41 has the annular projection 42 of trapezoidal in cross section formed in the peripheral portion and the convex projection 43 of flat trapezoidal in cross section formed in the central portion.

Similarly to the first and second embodiments shown in FIGS. 1 and 2, by the structure of this third embodiment and through incorporation of the inexpensive ferrite magnet and the rare earth magnet having superior magnetic properties, both magnets can be utilized stably and magnetically effectively, thereby producing the small-sized, inexpensive magnetic field-generating device.

EXAMPLE 1

In the magnetic field generating device of the structure shown in FIG. 1, an anisotropic strontium ferrite magnet of (BH)max=4 MGOe was used as the central ferrite magnet, an anisotropic Fe-B-R series magnet of (BH)max=35 MGOe was used as the rare earth magnet, the diameter of the pole pieces was set to a certain (850 mm), and the spacing between the pole pieces was set to 450 mm. Under the condition of accomplishing the same degree of uniformity (60 ppm or less) within the same range of magnetic field (300 mm, DSV), the dimensional ratio between the ferrite magnet and the rare earth magnet was obtained while changing the field strength (Bg) in the central portion of the air gap to 800 G, 1000 G, and 1200 G, and subjected to examination. The results are listed in Table 1.

Figure 9:
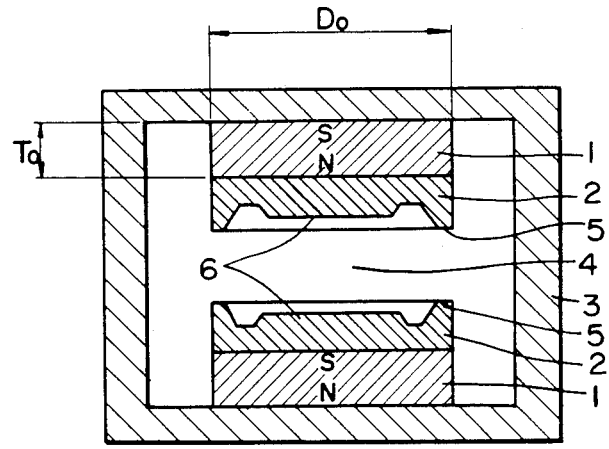
FIG. 9 is a vertical sectional view showing a conventional magnetic field-generating device for NMR-CT.

For purposes of comparison, the conventional magnetic field generating device of the structure shown in FIG. 9 was tested wherein only an anisotropic Fe-B-R series magnet (having an outer diameter $D_0$ and a thickness $T_0$) of $(BH)max=35$ MGOe was used as the permanent magnet segment, the diameter of the pole pieces was set to a certain (850 mm), and the spacing between the pole pieces was set to 450 mm. Under the condition of accomplishing the same degree of uniformity (60 ppm or less) within the same range of magnetic field (300 mm, DSV), the dimensional ratio of the permanent magnet segment between the present invention and the conventional structure was obtained while changing the field strength (Bg) in the central portion of the air gap to 800 G, 1000 G, and 1200 G, and subjected to examination. The results are listed also in Table 1.

TABLE 1

| Bg(G) in Gap Center | Present Invention ($D_2$ = constant) | | Ratio between Present Invention and Conventional | |
|---|---|---|---|---|
| | $T_1/T_2$ | $D_2/D_1$ | $D_0/D_2$ | $T_0/T_1$ |
| 800 | 2.3 | 1.08 | 1 | 0.4 |
| 1000 | 2.5 | 1.17 | 1 | 0.5 |
| 1200 | 2.7 | 1.30 | 1 | 0.6 |

As will be appreciated from Table 1, the magnetic field-generating device of the present invention can give a high degree of uniformity within the air gap by setting the optimum dimensional ratio between the ferrite magnet and the rare earth magnet depending on a desired field strength within the air gap. In comparison with the conventional device having an equivalent field strength, the present invention holds the height of the permanent magnet segment down to an extent not causing a problem at the practical point of view and can reduce the amount of use of expensive rare earth magnet material to half or so, thus, can provide the small-sized, economical magnetic field-generating device.

EXAMPLE 2

In the magnetic field-generating device of the structure shown in FIG. 3, an anisotropic Fe-B-R series magnet of $(BH)max=35$ MGOe was used as the rare earth magnet, an anisotropic strontium ferrite magnet of $(BH)max=4$ MGOe was used as the ferrite magnet, the diameter of the pole pieces was set to a certain (850 mm), and the spacing between the pole pieces was set to 450 mm. Under the condition of accomplishing the same degree of uniformity (60 ppm or less) within the same range of magnetic field (300 mm, DSV), the dimensional ratio between the ferrite magnet and the rare earth magnet was obtained while changing the field strength (Bg) in the central portion of the air gap to 800 G, 1000 G, and 1200 G, and subjected to examination. The results are listed in Table 2.

For purposes of comparison, the conventional magnetic field-generating device of the structure shown in FIG. 9 was tested wherein only an anisotropic Fe-B-R series magnet (having the outer diameter $D_0$ and the thickness $T_0$) of $(BH)max=35$ MGOe was used as the permanent magnet segment, the diameter of the pole pieces was set to a certain (850 mm), and the spacing between the pole pieces was set to 450 mm. Under the condition of accomplishing the same degree of uniformity (60 ppm or less) within the same range of magnetic field (300 mm, DSV), the dimensional ratio of the permanent magnet segment between the present invention and the conventional structure was obtained while changing the field strength (Bg) in the central portion of the air gap to 800 G, 1000 G, and 1200 G, and subjected to examination. The results are listed also in Table 2.

TABLE 2

| Bg(G) in Gap Center | Present Invention ($D_4$ = constant) | | Ratio between Present Invention and Conventional | |
|---|---|---|---|---|
| | $T_4/T_3$ | $D_4/D_3$ | $D_0/D_4$ | $T_0/T_4$ |
| 800 | 2.3 | 2.0 | 1 | 0.4 |
| 1000 | 2.5 | 1.88 | 1 | 0.5 |
| 1200 | 2.7 | 1.72 | 1 | 0.6 |

As will be appreciated from Table 2, the magnetic field-generating device of the present invention can give a high degree of uniformity within the air gap by setting the optimum dimensional ratio between the ferrite magnet and the rare earth magnet depending on a desired field strength within the air gap. In comparison with the conventional device having an equivalent field strength, the present invention holds the height of the permanent magnet segment down to an extent not causing a problem at the practical point of view and can reduce the amount of use of expensive rare earth magnet material to half or so, thus, can provide the small-sized, economical magnetic field-generating device.

What is claimed is:

1. In a magnetic field-generating device for nuclear magnetic resonance-computerized tomography which includes a yoke having opposed mounting elements, a pair of permanent magnetic segments respectively mounted on said opposed mounting portions of said yoke to extend towards each other and define an air gap therebetween, and separate pole pieces respectively attached to facing surfaces of the permanent magnetic segments to provide a magnetic field within said air gap, the improvement wherein each said permanent magnet segment is composed of a ferrite magnet and a rear earth magnet positioned around said ferrite magnetic, both said ferrite magnet and said rare earth magnetic having the same magnetization direction, said ferrite magnet having a thickness in the direction between the mounting element to which it is attached and said air gap which is greater than the corresponding thickness of said rare earth magnet, said rare earth magnet overlapping said ferrite magnet as they extend towards said air gap.

2. In a magnetic field-generating device for nuclear magnetic resonance-computerized tomography which includes a yoke having opposed mounting elements, a pair of permanent magnetic segments respectively mounted on said opposing mounting portions of said yoke to extend towards each other and define an air gap therebetween, and separate pole pieces respectively attached to facing surfaces of the permanent magnetic segments to provide a magnetic field within said air gap, the improvement wherein each said permanent magnet segment is composed of a rare earth magnet and a ferrite magnet positioned around said rare earth magnet, both said rare earth magnet and said ferrite magnet having the same magnetization direction, said ferrite magnet having a thickness in the direction between the mounting element to which it is attached and said air gap which is greater than the corresponding thickness of said rare earth magnet, said ferrite magnet overlapping said rare earth magnet as they extend towards said air gap.

3. A magnetic field-generating according to claims 1 or 2, wherein said opposite mounting portions of said yoke are composed of plate-like yoke pieces, and wherein said yoke includes a plurality of column-like yoke pieces connected between said plate-like yoke pieces.

4. A magnetic field-generating according to claims 1 or 2, wherein said yoke is a circular cylinder-like yoke with both ends closed and which has an opening in its peripheral wall.

5. A magnetic field-generating according to claims 1 or 2, wherein said yoke is a quadrangular cylinder-like yoke having an opening which extends horizontally.

6. A magnetic field-generating according to claims 1 or 2, wherein each pole piece is a disc-like pole piece having an annular projection of trapezoidal cross section formed in a peripheral portion thereof.

7. A magnetic field-generating according to claims 1 or 2, wherein each pole piece is a disc-like pole piece having an annular projection of trapezoidal cross section formed in a peripheral portion thereof and a convex projection of trapezoidal cross section formed in a central portion thereof.

8. A magnetic field-generating according to claims 1 or 2, wherein each permanent magnet segment is composed of an anisotropic Fe-B-R series magnet and an anisotropic strontium ferrite magnet.

9. A magnetic field-generating according to claims 1 or 2, wherein the ratio ($T_R/T_F$) of the thickness ($T_R$) of the rare earth magnet to the thickness ($T_F$) of the ferrite magnet composing each permanent magnet segment is not greater than a half.

* * * * *

UNITED STATES PATENT AND TRADEMARK OFFICE
CERTIFICATE OF CORRECTION

PATENT NO. : 4,777,464

DATED : October 11, 1988

INVENTOR(S) : Hirofumi Takabayashi et al.

It is certified that error appears in the above-identified patent and that said Letters Patent are hereby corrected as shown below:

On the title page insert,

-- [30] Foreign Application Priority Data

September 27, 1986    Japan  ............. 147978/61

September 27, 1986    Japan  ............. 147979/61 --.

Signed and Sealed this

Twenty-eighth Day of February, 1989

Attest:

DONALD J. QUIGG

Attesting Officer    Commissioner of Patents and Trademarks